United States Patent
Tsumura et al.

(10) Patent No.: US 7,279,365 B2
(45) Date of Patent: Oct. 9, 2007

(54) METHOD OF MANUFACTURING HEAT CONDUCTIVE SUBSTRATE

(75) Inventors: Tetsuya Tsumura, Ikoma (JP); Shinya Tanaka, Ichishi-gun (JP); Michihiro Miyauchi, Suita (JP); Hisatoshi Atsumo, Mino (JP); Yoshiyuki Miyoshi, Tsu (JP)

(73) Assignee: Matsushita Electric Industrial Co., Ltd., Kadoma-Shi (JP)

( * ) Notice: Subject to any disclaimer, the term of this patent is extended or adjusted under 35 U.S.C. 154(b) by 368 days.

(21) Appl. No.: 10/488,547

(22) Filed: Mar. 4, 2004

(65) Prior Publication Data

US 2005/0037543 A1    Feb. 17, 2005

(30) Foreign Application Priority Data

Mar. 29, 2002    (JP)    ............................. 2002-096505

(51) Int. Cl.
- *H01L 21/324*    (2006.01)
- *H01L 21/447*    (2006.01)
- *H01L 21/603*    (2006.01)

(52) U.S. Cl. ...................... 438/122; 438/107
(58) Field of Classification Search ..................... None
See application file for complete search history.

(56) References Cited

U.S. PATENT DOCUMENTS

| | | | |
|---|---|---|---|
| 6,570,099 B1 * | 5/2003 | Hirano et al. | 174/258 |
| 2003/0175465 A1 * | 9/2003 | Watanabe et al. | 428/40.1 |

FOREIGN PATENT DOCUMENTS

| | | |
|---|---|---|
| JP | 11312750 | * 11/1999 |
| JP | 2001-203313 | 7/2001 |
| JP | 2001-210764 | 8/2001 |
| JP | 2001-251037 | 9/2001 |
| JP | 2002-33558 | 1/2002 |
| JP | 2002-359315 | 12/2002 |

\* cited by examiner

*Primary Examiner*—Mary Wilczewski
*Assistant Examiner*—Pamela E Perkins
(74) *Attorney, Agent, or Firm*—Steptoe & Johnson LLP

(57) ABSTRACT

The present invention offers a method of manufacturing a heat conductive substrate, with which substrate contamination on the surface of lead frame due to oozing or push out of thermosetting resin composite during heat-pressurization is suppressed. The oozing or push out of thermosetting resin composite from the through hole of lead frame can be prevented by a film attached on the components mounting surface of lead frame.

12 Claims, 14 Drawing Sheets

FIG. 13A1

METHOD OF MANUFACTURING HEAT CONDUCTIVE SUBSTRATE

TECHNICAL FILED

The present invention relates to a heat conductive substrate (high heat-dissipation board) used for power circuits of electronic apparatus.

BACKGROUND ART

Electronic apparatus has become compact in shape and more and more sophisticated in the function. Semiconductor devices and other electronic components are requested to have a higher density and higher grade functions. In order to meet the recent technological needs, circuit boards are requested to be small in size, yet capable of having a number of electronic components in high mounting density. As a result, it has become an important task to efficiently dissipate the heat generated by densely mounted power semiconductor devices. A circuit board of improved heat dissipation is disclosed in Japanese Patent Laid-Open Application No. 2002-33558. A conventional method of manufacturing heat conductive substrate is described below with reference to the drawing. FIG. 14 is a cross sectional view showing the structure of conventional heat conductive substrate. Sheet-formed thermosetting resin composite 100 has been provided by mixing a thermosetting resin and a heat conductive filler. Lead frame 300 has been provided in the shape of a circuit pattern. Heat dissipating metal plate 500 and lead frame 300 have been integrated, with sheet-formed thermosetting resin composite 100 in between, to form a single body.

Electronic components 400 are mounted on lead frame 300.

However, the above described conventional method of manufacturing heat conductive substrate, in which a thermosetting resin composite material is heat-pressurized for integration, has following problems. Namely, the thermosetting resin composite material is softened and gets a fluidity during the heat-pressurizing process. As a result, the thermosetting resin composite is not only delivered to the space between the circuit patterns of lead frame 300 but it also oozes out on the surface of lead frame 300, or pushes up above.

If the composite material gets cured as it is in the oozed state or in the pushed-up state, the portion remains as stain on the wiring pattern or electrode pattern.

It leads to a problem of imperfect electrical or physical connection when electronic components are mounted on the substrate. As a countermeasure against the problem, viscosity during heat-pressurization of thermosetting resin composite 100 may be raised for controlling the fluidity. This may be effective to curtail the oozing and push-up of resin composite on the surface of lead frame 300; however, it generates new problems that the adhesive property between thermosetting resin composite 100 and lead frame 300 deteriorates, and the thermosetting resin composite readily generates pin-holes and bubbles.

The present invention offers a method of manufacturing heat conductive substrates, with which method the stain on the surface of lead frame 300 due to oozing or push-up of thermosetting resin composite 100 during heat-pressurization can be suppressed. The present invention also offers a method for providing electrically-isolated land portion with a high dimensional accuracy in an efficient way.

DISCLOSURE OF INVENTION

The present invention offers a method of manufacturing heat conductive substrates, which method comprising the steps of forming a conductive circuit element by processing a metal sheet to a certain specific pattern; attaching a film on the components mounting surface of the conductive circuit element; providing in advance an integrated body of sheet-formed flexible thermosetting resin composite and a heat dissipation plate, and forming a laminated member by laminating the integrated body on the conductive circuit element in a manner that the thermosetting resin composite side of the integrated body makes contact with the conductive circuit element at the surface reverse to components mounting surface; and then heat-pressurizing the laminated member so that a through hole in the conductive circuit element is filled with the thermosetting composite, and bringing the laminated member into an integrated body by turning the thermosetting composite to a half-cured state; completely curing the thermosetting composite contained in the laminated body; and peeling the film off the laminated member in a half-cured state or completely cured state.

The present invention offers a method of manufacturing heat conductive substrates, which method comprising the steps of forming a conductive circuit element containing an electrically isolated land portion and a connecting portion connecting the land portion by processing a metal sheet to a certain specific pattern; attaching a first film to the conductive circuit element at the surface reverse to components mounting surface; removing the first film at the connecting portion and the corresponding location; attaching a second film on the components mounting surface of conductive circuit element and then peeling the first film attached at the reverse surface off; providing in advance an integrated body of sheet-formed flexible thermosetting resin composite and a heat dissipation plate, and forming a laminated member by laminating the integrated body on the conductive circuit element in a manner that the thermosetting resin composite side of the integrated body makes contact with the conductive circuit element at the surface reverse to components mounting surface; and then heat-pressurizing the laminated member so that a through hole in the conductive circuit element is filled with the thermosetting composite, and bringing the laminated member into an integrated body by turning the thermosetting composite to a half-cured state; completely curing the thermosetting composite contained in the laminated member; and peeling the second film off the laminated member in a half-cured state or completely cured state.

BRIEF DESCRIPTION OF THE DRAWINGS

FIG. 13A, FIG. 13A1 and FIG. 13B are cross sectional views used to describe other exemplary process of manufacturing heat conductive substrates in embodiment 5.

DETAILED DESCRIPTION OF PREFERRED EMBODIMENTS

Figure 1A:
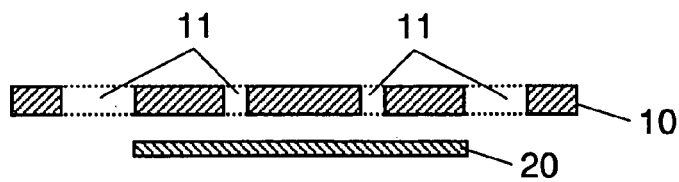
FIG. 1A through 1F are cross sectional views used to describe the process of manufacturing heat conductive substrates in accordance with a first exemplary embodiment of the present invention.

A series of manufacturing processes in accordance with exemplary embodiments of the present invention is carried out by making use of molding dies. However, the molding dies are not shown in the drawings unless they are indispensable to describing the embodiment.

Now in the following, embodiments of the present invention are described referring to the drawings.

The drawings are intended to offer conceptual ideas of the invention; they are not aimed to represent precise dimensional status.

First Exemplary Embodiment

Reference is made to FIG. 1A, conductive circuit element (hereinafter referred to as lead frame) 10 is made of aluminum, copper, silver, iron or the like metal having a high electrical conductivity and a high heat conductivity.

Depending on needs, the metal member may be protected by an anti-corrosive treatment. Lead frame 10 is provided with certain specific pattern 12 and through hole 11 by means of press-punching, etching, laser beam machining, etc. One of the surfaces of lead frame 10 is roughened to provide a better adhesiveness with thermosetting resin composite 30 to be applied at a later stage.

On the surface of lead frame 10, on which surface electronic components are mounted later, a solder resist (not shown) is formed.

Figure 2A:
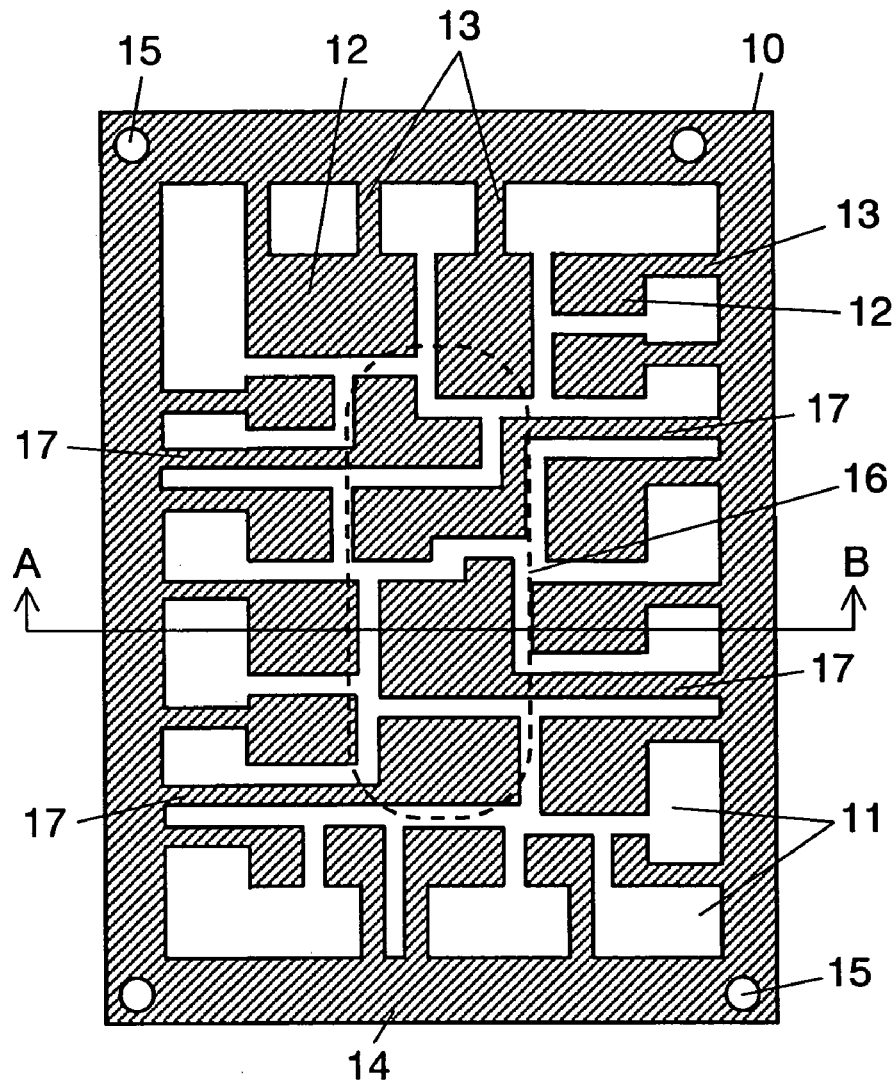
FIG. 2A is a plan view showing a state of conductive circuit element in embodiment 1.
Figure 2B:
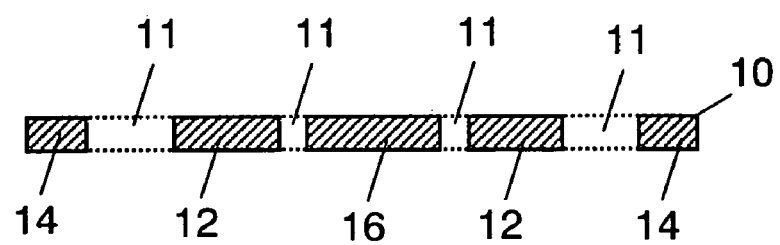
FIG. 2B is a cross sectional view of the conductive circuit element shown in FIG. 2A, sectioned at plane A-B.

As shown in FIG. 2A and FIG. 2B, lead frame 10 is provided with pattern 12, connection terminal 13, frame 14 and orientation hole 15.

It is further provided with electrically isolated land portion 16 (a kind of isolated island 18, which is to be described later).

Figure 3A:
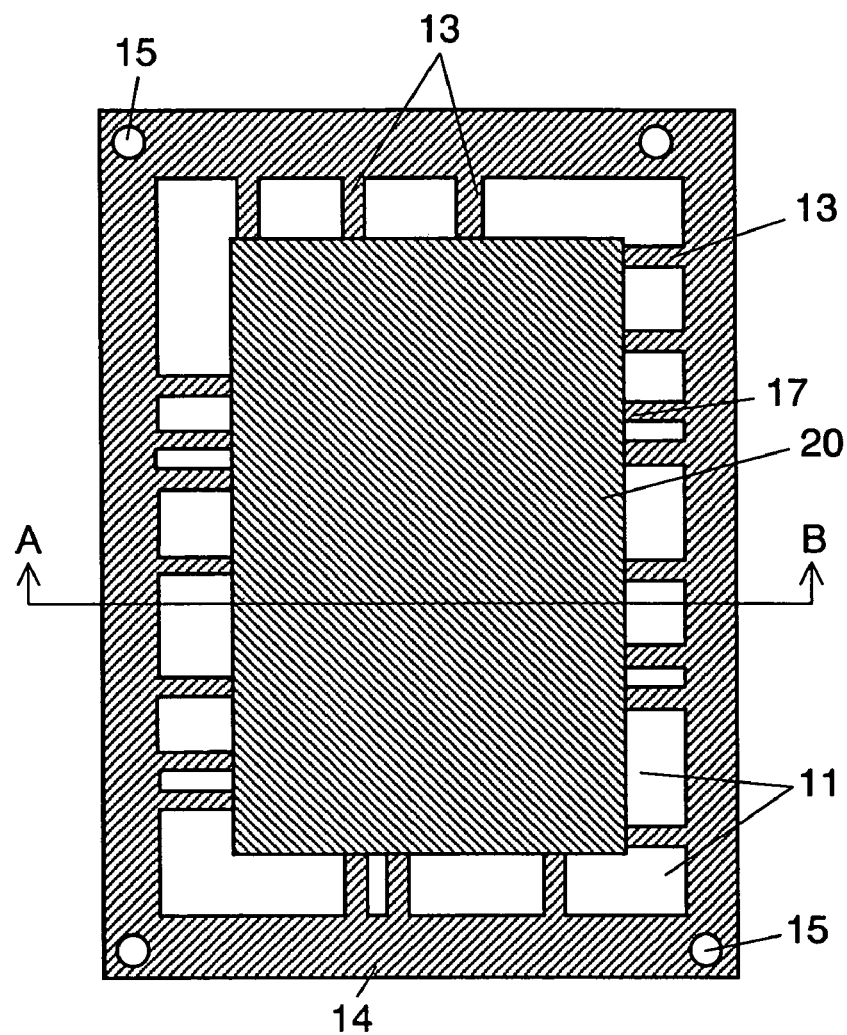
FIG. 3A is a plan view showing a state of conductive circuit element in embodiment 1.
Figure 3B:
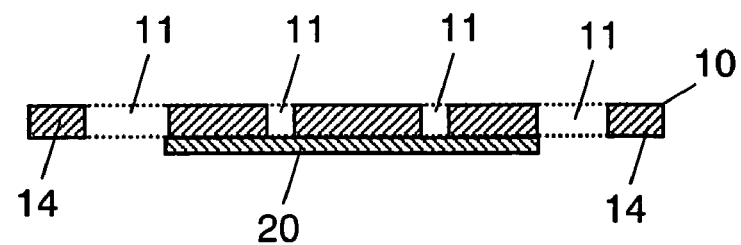
FIG. 3B is a cross sectional view of the conductive circuit element shown in FIG. 3A, sectioned at plane A-B.

Also provided is land portion holding terminal 17 for holding land portion 16 at a right location. As shown in FIGS. 3A and 3B, formation film 20 is attached on the components mounting surface of lead frame 10 covering an area where pattern 12 and land portion 16 are formed. As to method of attaching the film, an adhesive film may be attached to. Or, after applying an adhesive agent on lead frame 10 and then an ordinary film may be attached thereon. The point of importance is that the film is attached firmly so that there is no air gap, and the film does not peel off easily.

Formation film 20 may be made of any kinds of material, in so far as it has an air permeability and blocks penetration of thermosetting resin composite 30. A non-woven fabric sheet is used in the present embodiment 1. The sheet surely prevents thermosetting resin composite 30 from oozing out or pushing up, on the surface of pattern 12 by way of through hole 11 of lead frame 10.

Figure 1B:
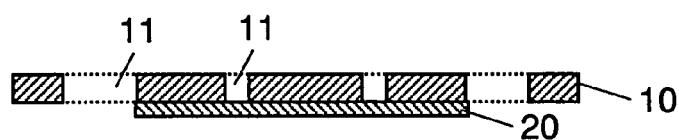
Figure 1C:
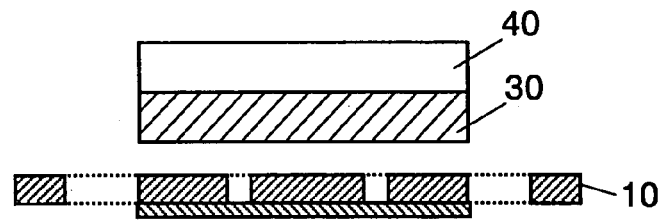
Figure 1D:
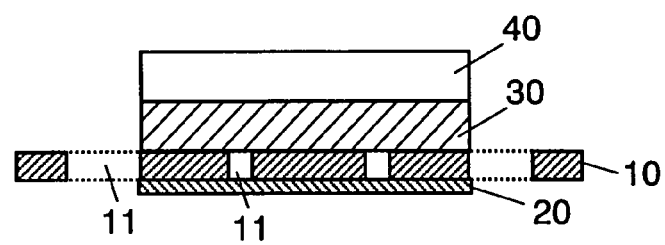

The sheet can release the air incidentally taken in when formation film 20 is attached, the air contained in thermosetting resin composite 30, and the air squeezed into through hole 11 by thermosetting resin composite 30 which is intruding to through hole 11 at later process stage. A foam sheet, whose adhesive agent starts making foams at a temperature 100° C. and higher, may be used for formation film 20. The adhesive agent which makes foams at 100° C. and higher deteriorates the adhesive strength, and it makes the later operation to peel formation film 20 off easier. Next, as shown in FIG. 1C, sheet-formed thermosetting resin composite (hereinafter referred to as sheet) and heat dissipation plate 40 are integrated to form an integrated body (hereinafter referred to as integrated body). And then, as shown in FIG. 1D, the integrated body is laminated on the surface without having formation film 20 (the surface reverse to components mounting surface) of lead frame 10 so that thermosetting resin composite 30 side of the integrated body makes contact with lead frame 10. Sheet 30 at this stage is a flexible uncured thermosetting resin composite. The 'flexible' here means that the sheet 30 is soft enough for bending. An exemplary composition of it is; an inorganic heat conductive filler for 70-95 parts by weight, and thermosetting resin, thermoplastic resin (pre-gelatinizing agent), hardener and hardening accelerator, etc. for 5-30 parts by weight. Alumina is a preferred material for the inorganic heat conductive filler.

As for the thermosetting resin, any known such resin may be used; however, an epoxy resin is preferred in view of the heat resistance. More preferred and often used is an epoxy resin in liquid state. As for the thermoplastic resin for use as pre-gelatinizing agent, an acrylic resin is preferred. For the hardener, a latent hardener is preferred and used. In addition, it may contain a flame retardant.

Figure 1E:
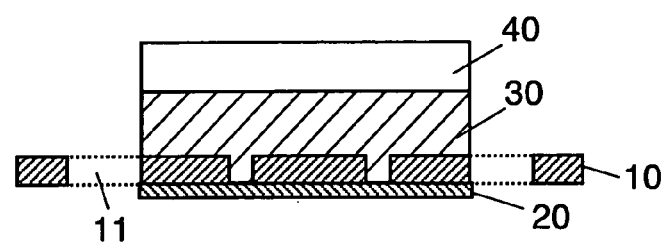

The material is put into sheet form by the doctor blade method, coater method, push out molding process, rolling process, etc. Thickness of sheet 30 is 0.8-2 mm; preferably 0.8-1.6 mm. Heat dissipation plate 40 is made of a metal of high heat-conductivity, such as iron, copper, aluminum, or Alumite-processed aluminum, or an alloy of such metals; shaped to a certain specific form. The integrated body is provided by placing sheet 30 on heat dissipation plate 40 and laminating them with a pressure. Special care must be taken to keep the thickness of thermosetting resin composite 30 uniform, and not to allow the air to be taken into during the laminating. And then, as shown in FIG. 1E, the laminated member is heat-pressed at 100-130° C. for 2 min. During the processing, through hole 11 of lead frame 10 is filled with a portion of thermosetting resin composite 30. As a consequence, lead frame 10 and heat dissipation plate 40 are unitized with thermosetting resin composite 30 in between, although the resin composite is in a half-cured state. This can be provided in a certain predetermined uniform thickness. Since formation film 20 has been attached to cover through hole 11, thermosetting resin composite 30 filling through hole 11 does not ooze out or push up from through hole 11. The air occupying through hole 11, or the air incidentally taken into the laminated member, can be released or purged because of the air permeating property of formation film 20. Thermoplastic resin used for pre-gelatinizing agent absorbs liquid component contained in thermosetting resin composite, when it is heated at around 100° C. As the result, the thermosetting resin composite becomes solidified to a half-cured state.

Figure 1F:
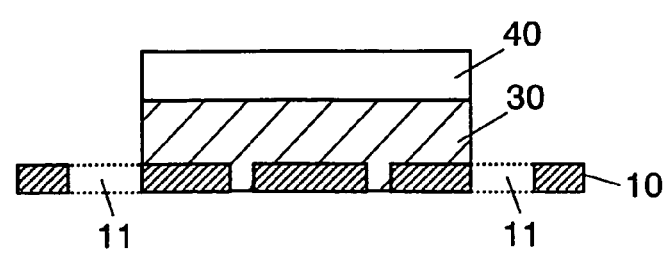

Since the above-described reaction takes place at a temperature around 100° C., reaction of curing the thermosetting resin, e.g. an epoxy resin, has not yet taken place. In other words, lead frame 10 and heat dissipation plate 40 can be unitized before the curing reaction of epoxy resin takes place. Reaction of the pre-gelatinizing agent implements a certain level of hardness in several minutes. This means that it can be released from the dies within a short time. When, the thermosetting resin is not yet cured, so the molded piece can be taken out of dies easily. This contributes to an improved productivity. Next, as shown in FIG. 1F, formation film 20 is peeled off the half-cured laminated member. After that, thermosetting resin composite 30 is completely cured by a heat treatment at a temperature higher than curing temperature of the thermosetting resin for a certain required time. In this way, lead frame 10 and heat dissipation plate 40 are unitized with thermosetting resin composite 30 in between. Thus, an even-thickness heat conductive substrate whose lead frame 10 at the components mounting surface is flat and free from contamination is implemented.

The process steps until the above-described half-cured solidified stage do not fit to a bulk processing. However, since the molded pieces can be taken out of dies easily, they may be stocked for an appropriate quantity suitable to a treatment in thermostatic oven for the complete curing.

In this way, the production efficiency can be improved. It is preferred that the heat treatment in thermostatic oven is conducted in a pressurized environment (e.g. 3-5 atmospheric pressure) higher than the normal atmospheric pressure.

By so doing, the thermosetting resin can be cured while crushing the air contained between lead frame 10 and thermosetting resin composite 30.

As a result, separation of the two items can be suppressed. Although formation film 20 is peeled off at the half-cured state in the present embodiment 1, it may be peeled off after a complete curing, depending on property of formation film 20. As the final step, unnecessary portion of lead frame 10 such as terminal 17 for holding land portion is cut away, which process is not illustrated in the drawing. Depending on needs, lead frame 10 may be folded partly to provide a mounting terminal.

Various kinds of electronic components are mounted on the exposed surface of lead frame 10 to form a power circuit or the like circuit portions. It is attached to electronic apparatus so that it makes direct contact at the heat dissipation plate 40 side with heat-sink part of an apparatus, or with the chassis. Mounting of heat conductive substrate in an apparatus is thus completed. In FIG. 1D, the integrated body has been laminated so that the surface of thermosetting resin composite 30 makes contact with the surface of lead frame 10 having no formation film 20 (the surface reverse to components mounting side).

Instead of following the above-described processing sequence, sheet 30 and heat dissipation plate 40 may be laminated in the order on the surface of lead frame 10 at the surface having no formation film 20 (the surface reverse to components mounting side), and then heat-pressurized.

Second Exemplary Embodiment

Electrically isolated land portion 16 in embodiment 1 has been held and supported to a certain specific location by means of land portion holding terminal 17. The point of difference from embodiment 1 is that electrically isolated island 18 is held and supported to a certain specific location by connecting portion 19, in the present embodiment 2. Connecting portion 19 renders land portion holding terminal 17 as used in embodiment 1 unnecessary. This contributes to designing a higher-density circuit pattern, providing more freedom to the circuit design.

Figure 4A:
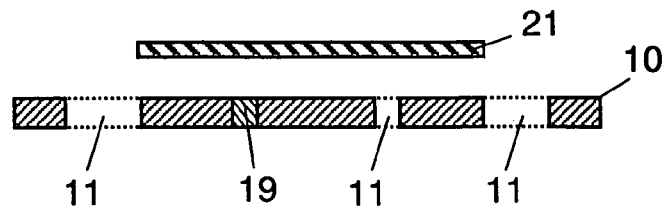
FIG. 4A through 4J are cross sectional views used to describe the process of manufacturing heat conductive substrates in accordance with a second exemplary embodiment of the present invention.

A method of manufacturing a heat conductive substrate using connecting portion 19 is described referring to the drawings. Those portions identical to those in embodiment 1 are represented by using the same symbols, and description on which is eliminated. Referring to FIG. 4A, lead frame 10 is made of a metal of high electrical conductivity and heat conductivity such as aluminum, copper, silver, iron, etc.

Depending on needs, the metal member may be provided with an anti-corrosive treatment. Lead frame 10 is provided with a certain specific pattern and through hole 11 processed by press-punching, etching, or a laser beam machining, etc. One of the surfaces of lead frame 10 is roughened for a better adhesiveness with thermosetting resin composite 30 to be laminated thereon at a later stage. A solder resist (not shown) is provided on lead frame 10 at the surface on which components are mounted later.

Figure 5A:
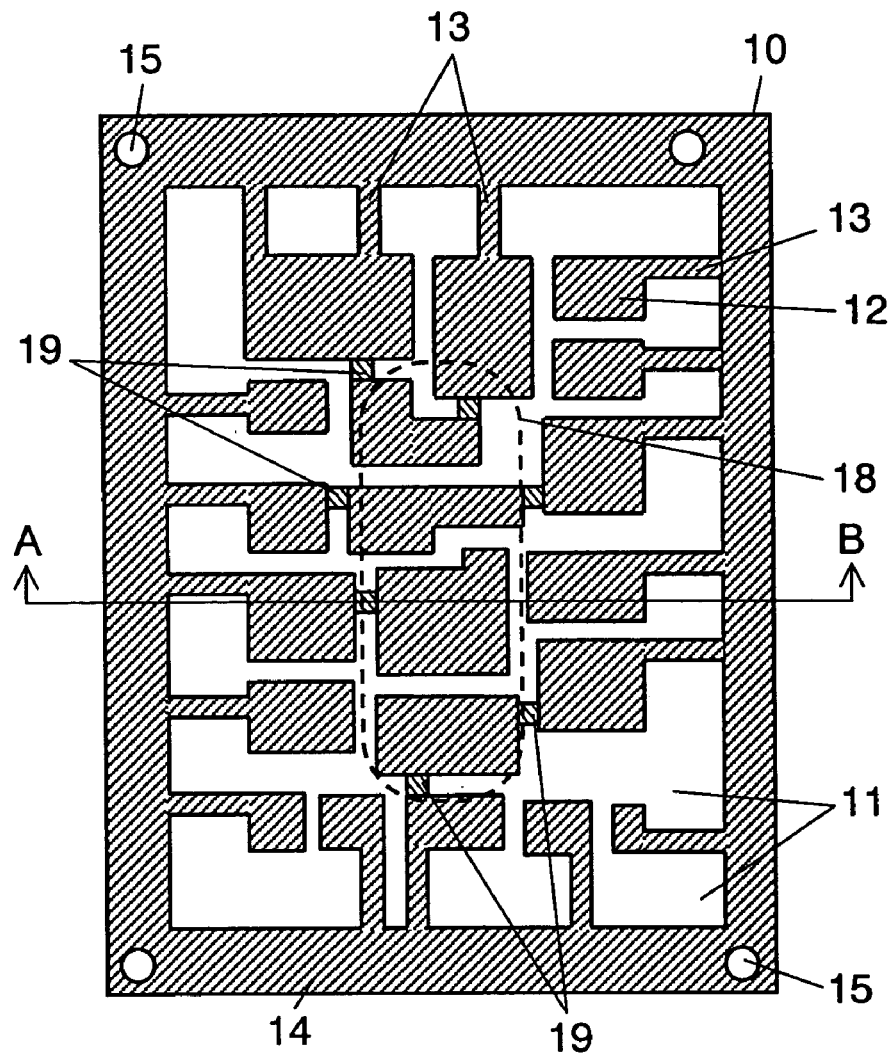
FIG. 5A is a plan view showing a state of conductive circuit element in embodiment 2.
Figure 5B:
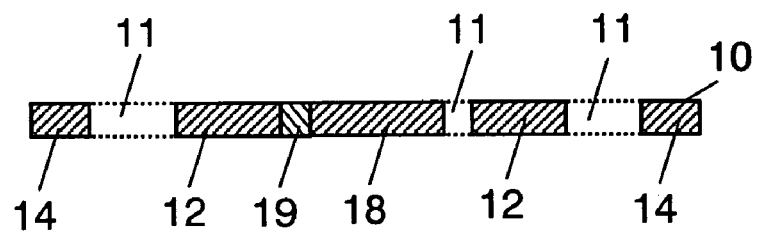
FIG. 5B is a cross sectional view of the conductive circuit element shown in FIG. 5A, sectioned at plane A-B.

As shown in FIG. 5A and FIG. 5B, lead frame 10 is provided with pattern 12, connection terminal 13, frame 14 and orientation hole 15. Electrically isolated island 18 is connected via connecting portion 19 with the adjacent pattern 12.

Isolated island 18 is thus held to a certain specific location.

Figure 4B:
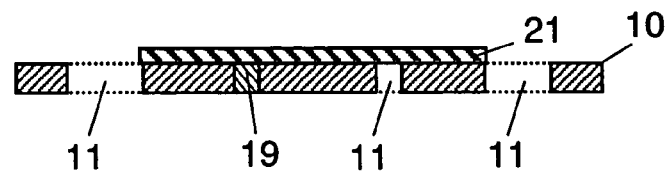
Figure 6A:
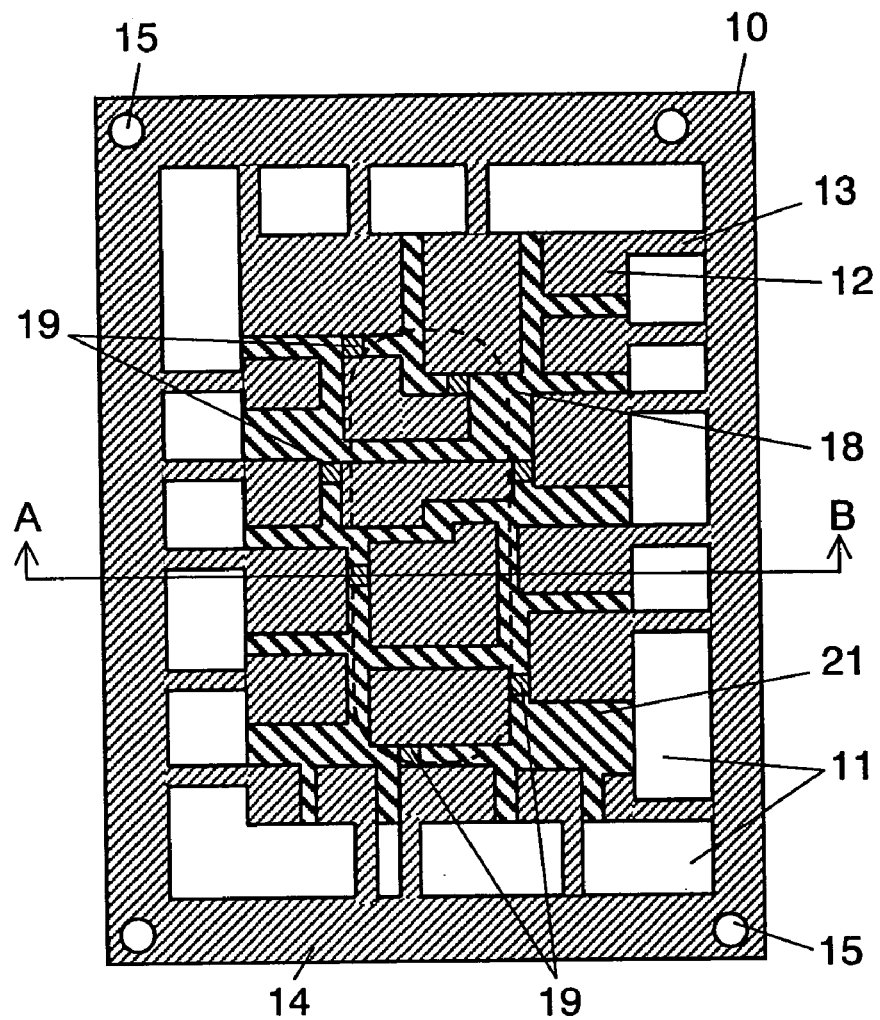
FIG. 6A is a plan view showing a state of conductive circuit element in embodiment 2.
Figure 6B:
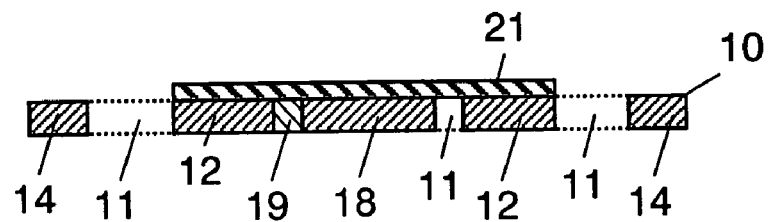
FIG. 6B is a cross sectional view of the conductive circuit member shown in FIG. 6A, sectioned at plane A-B.

As shown in FIG. 4B, FIG. 6A, FIG. 6B, etc., film 21 for the cutting of connecting portion is attached on lead frame 10 at the surface reverse to components mounting surface, covering the area where pattern 12 and isolated island 18 are formed. As to the method for attaching the film, an adhesive film may be attached; or, applying an adhesive agent on lead frame 10 and then an ordinary film may be attached thereon. The point of importance is that a film should be attached firmly without gap, and it does not peel off easily.

Figure 4C:
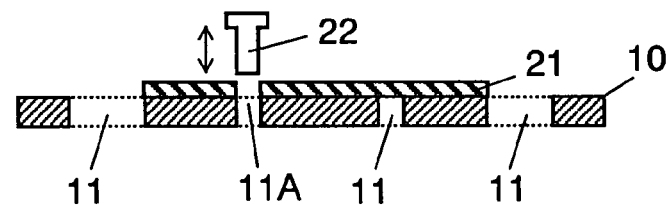
Figure 4D:
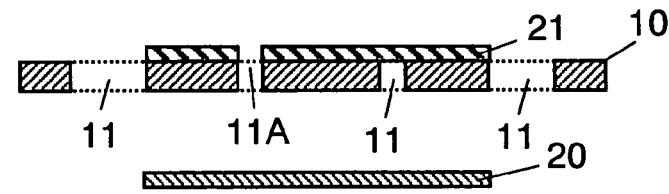
Figure 7A:
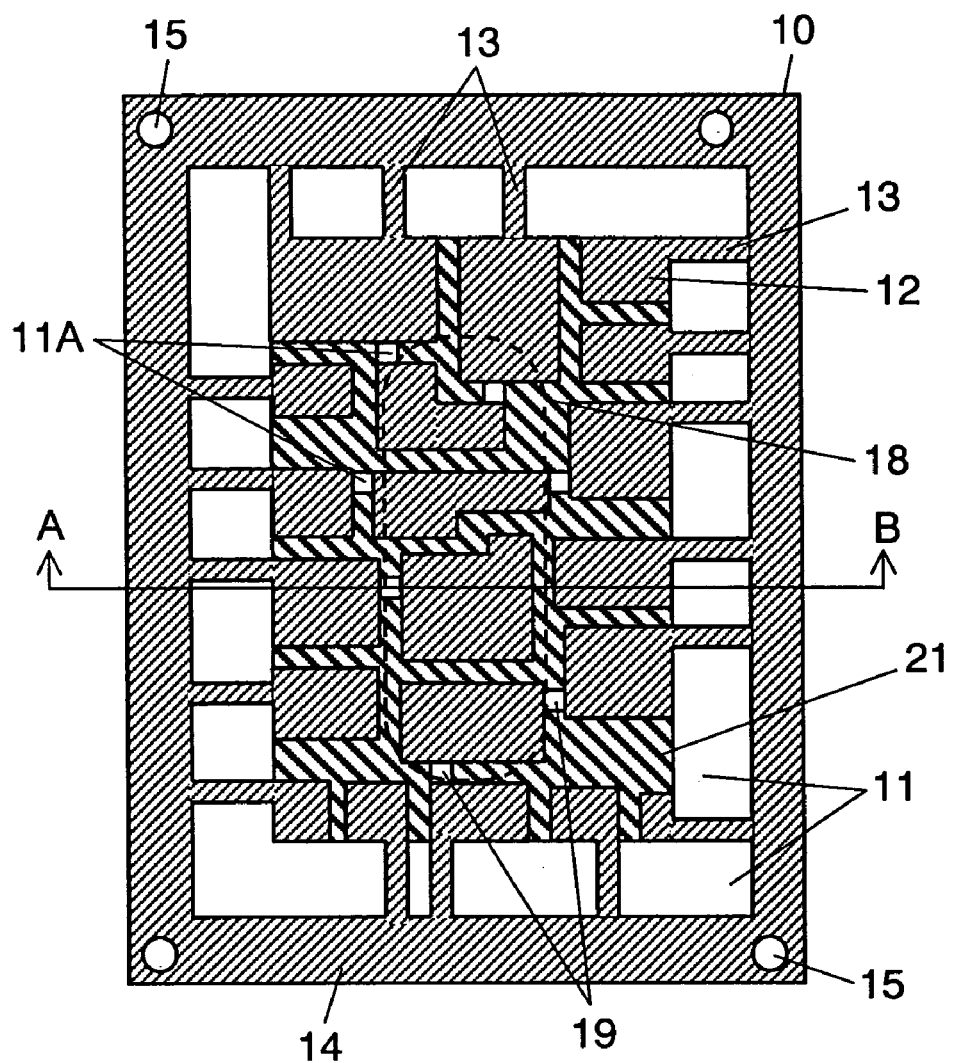
FIG. 7A is a plan view showing a state of conductive circuit element in embodiment 2.
Figure 7B:
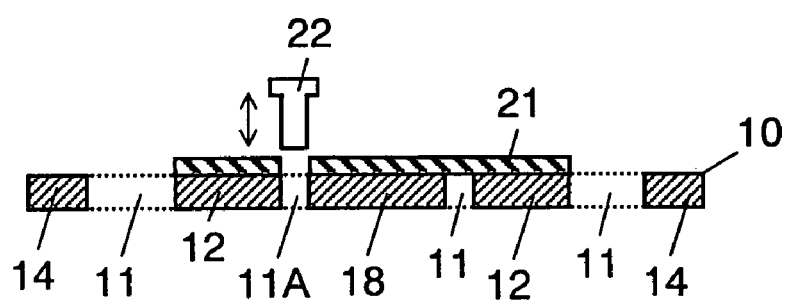
FIG. 7B is a cross sectional view of the conductive circuit element shown in embodiment 2, sectioned at plane A-B.

Next, as shown in FIG. 4C, FIG. 7A, FIG. 7B, etc., film 21 for the cutting of connecting portion is punched through by means of punching die 22, etc. at the place of connecting portion 19 and the corresponding location. In this way, through hole 11A is provided at the place where connecting portion 19 used to be. At the same time, isolated island 18 is held by film 21 for the cutting of connecting portion at a certain specific location. The punching work is conducted from the reverse surface towards components mounting surface. By punching in this direction, no burr is generated at the surface that have contact with thermosetting resin composite 30. Therefore, there will be least possibility of short circuit trouble with heat dissipation plate 40 due to the burr, or the like problem of low withstanding voltage, even in the future when thermosetting resin composite 30 will become still thinner.

Figure 4E:
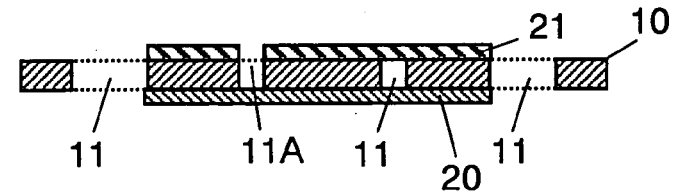
Figure 8A:
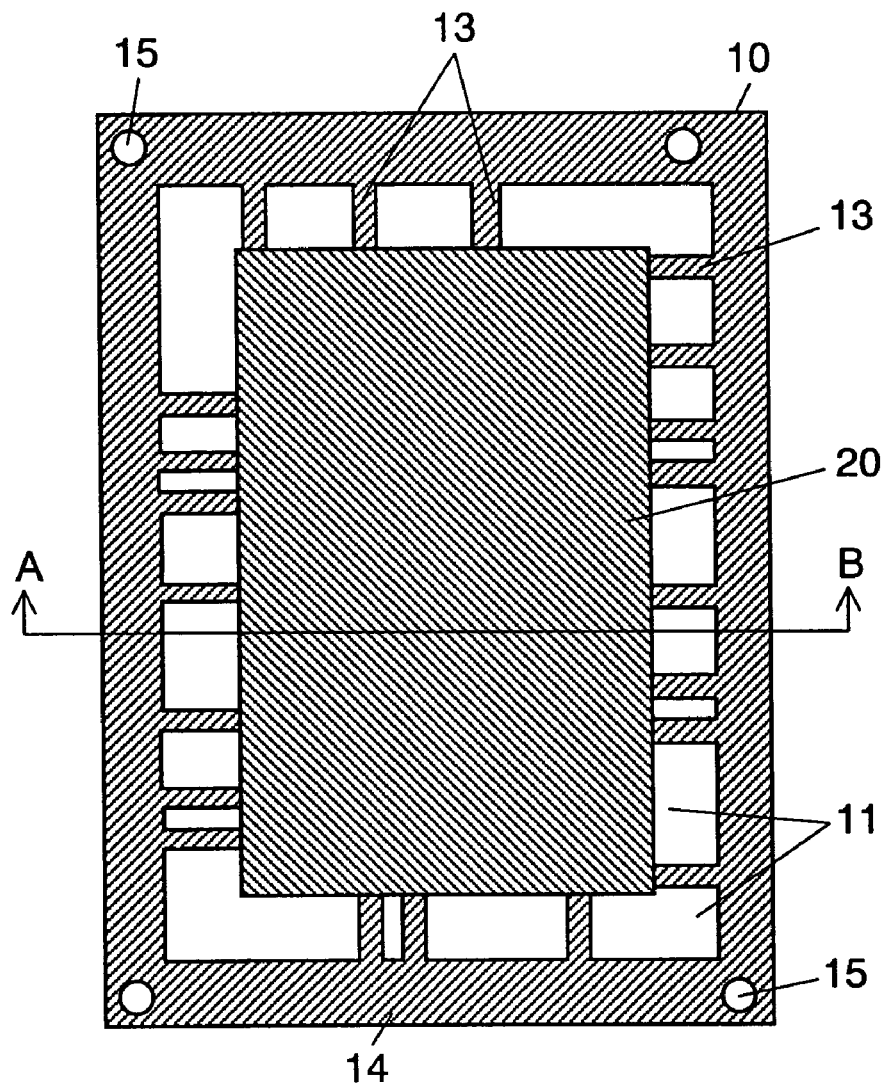
FIG. 8A is a plan view showing a state of conductive circuit element in embodiment 2.
Figure 8B:
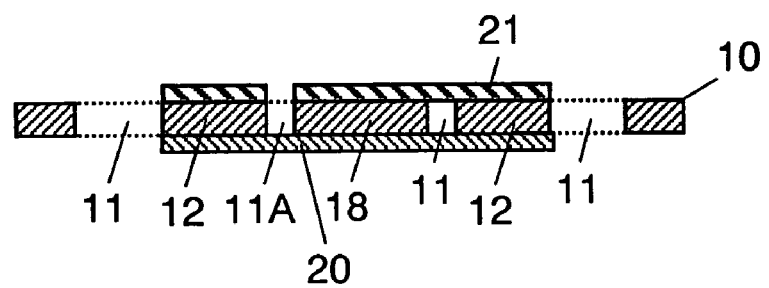
FIG. 8B is a cross sectional view of the conductive circuit element shown in FIG. 8A, sectioned at plane A-B.

Next, as shown in FIG. 4E, FIG. 8A, FIG. 8B, etc., formation film 20 is attached on the components mounting surface of lead frame 10, in the state where isolated island 18 is supported and held to a right place by film 21 for the cutting of connecting portion. When, formation film 20 covers the area where pattern 12 and isolated island 18 are formed. As to the method of attaching the film, an adhesive film may be attached, or applying an adhesive agent on lead frame 10 and then an ordinary film may be applied thereon. The point of importance is that a film should be attached firmly without gap, and it does not peel off easily.

Formation film 20 may be made of any kinds of material, in so far as it is provided with an air permeating property, and is capable of blocking the penetration of thermosetting resin composite 30.

A non-woven fabric sheet is used in the present embodiment 2. This surely prevents thermosetting resin composite 30 from oozing out, or pushing up, on the surface of pattern 12 from through hole 11 of lead frame 10.

Figure 4F:
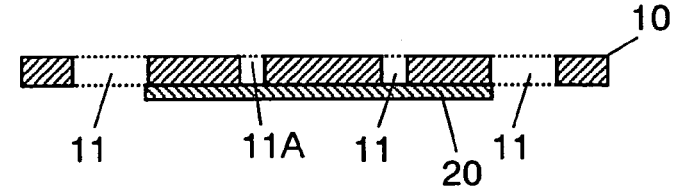
Figure 4G:
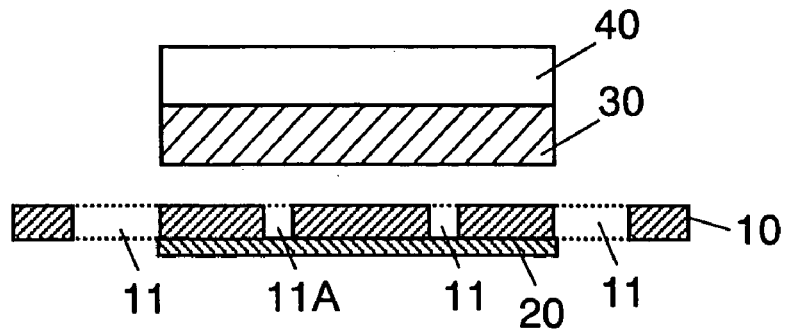
Figure 4H:
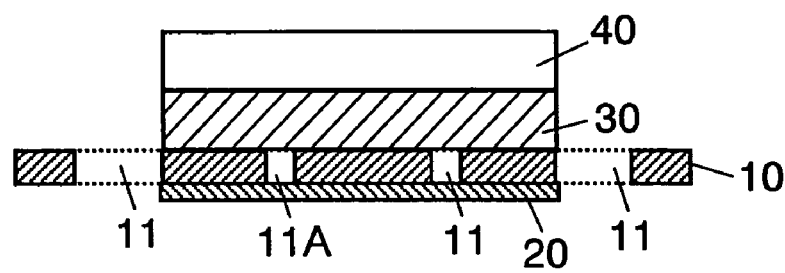
Figure 4I:
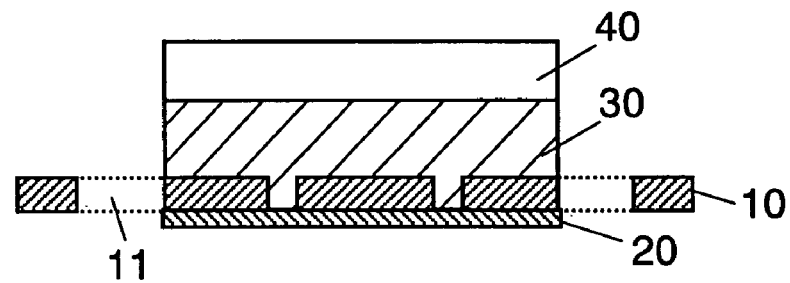
Figure 4J:
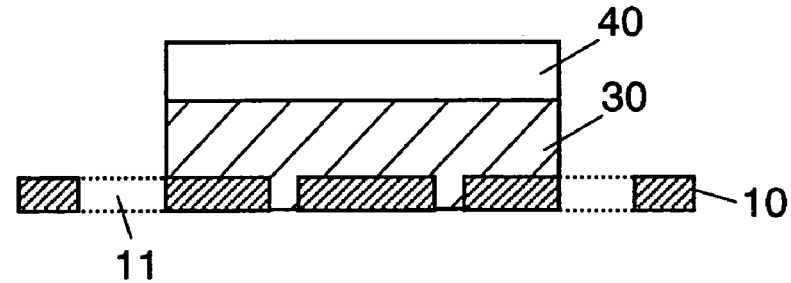
Figure 9A:
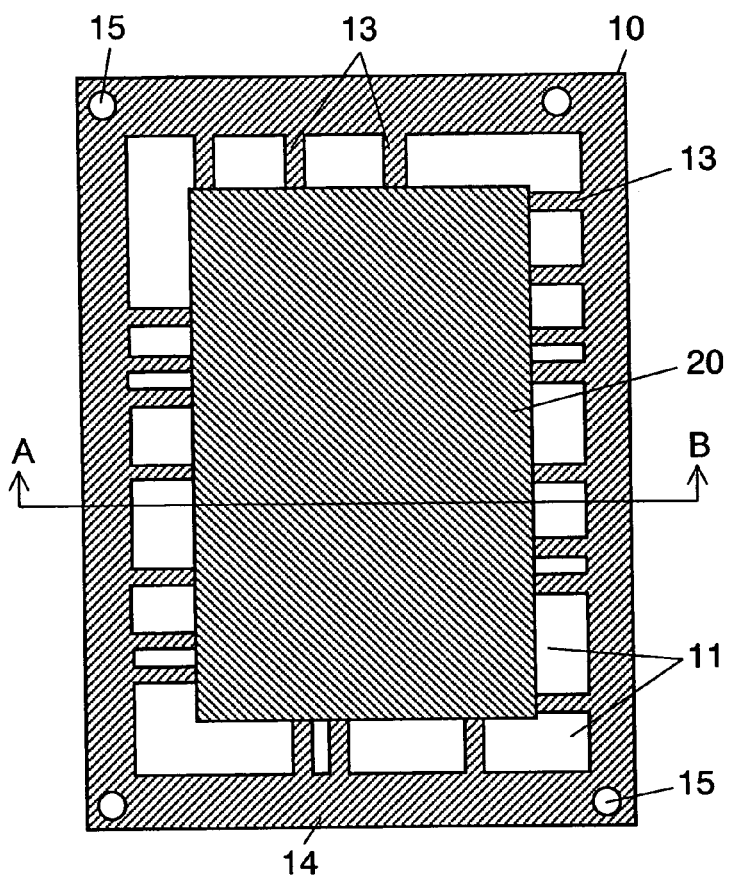
FIG. 9A is a plan view showing a state of conductive circuit element in embodiment 2.
Figure 9B:
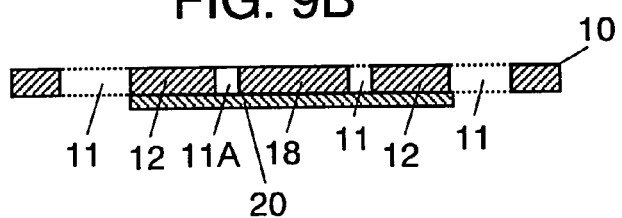
FIG. 9B is a cross sectional view of the conductive circuit element shown in FIG. 9A, sectioned at plane A-B.

The sheet can release the air incidentally taken in when formation film 20 is attached, the air contained in thermosetting resin composite 30, and the air squeezed into through hole 11 by thermosetting resin composite 30 which is intruding to through hole 11 at later process stage. Next, as shown in FIG. 4F, film 21 for the cutting of connecting portion is peeled off, while paying a good care that isolated island 18 supported and held by formation film 20 is not displaced from a certain specific location. In this way, isolated island 18 is held at a certain specific location by formation film 20, as shown in FIG. 9A and FIG. 9B. This state remains substantially the same as that in embodiment 1 shown in FIG. 3A and FIG. 3B.

The subsequent process steps (FIG. 4G through FIG. 4J) are substantially the same as those of embodiment 1 (FIG. 1C through FIG. 1F); therefore, no description is made here. At the final processing stage, unnecessary portion (not shown), if any, of lead frame 10 is removed by cutting it off. Depending on needs, lead frame 10 may be folded partly to provide a mounting terminal. Various kinds of electronic components are mounted on the exposed surface of lead frame 10 to form a power circuit or the like circuit portions. It is mounted in an electronic apparatus so that the heat dissipation plate 40 side makes direct contact with heat-sink part of the apparatus, or the chassis. Mounting of the heat conductive substrate in an apparatus is thus completed.

Third Exemplary Embodiment

Other exemplary process of attaching formation film 20 is described in the following.

Figure 10:
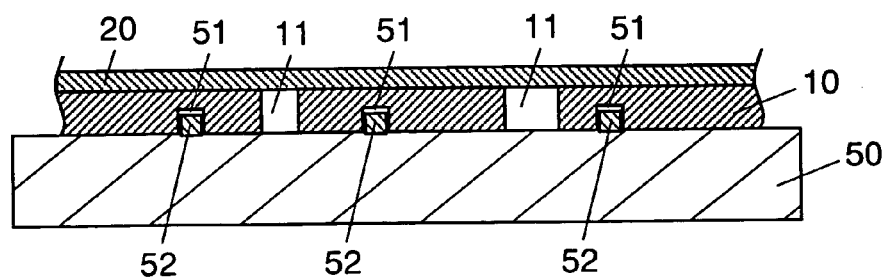
FIG. 10 is a cross sectional view used to show the process of attaching a formation film in accordance with a third exemplary embodiment of the present invention.

As shown in FIG. 10, alignment jig 50 is provided with aligning protrusion 52 at a place corresponding to aligning hollow 51 of lead frame 10.

Aligning hollow 51 and aligning protrusion 52 are coupled and fixed together.

When attaching formation film 20 on lead frame 10, aligning hollow 51 of lead frame 10 is engaged with aligning protrusion 52 of jig 50 to a right position In this way, formation film 20 can be surely attached on lead frame 10 surely at the right location without displacement. Aligning hollow 51 is provided specifically at such a place that is prone to have dislocation; for example, the area of land portion 16 which is held by land portion holding terminal 17. By so doing, land portion 16 can be surely supported and held by aligning protrusion 52. Therefore, formation film 20 can be attached on lead frame 10 without causing a displacement with land portion 16 or other parts. Since aligning hollow 51 is not penetrating through to the components mounting surface, even a surface area just above the aligning hollow 51 can be used for wiring and mounting purposes.

Thus a precise location setting can be accomplished without sacrificing a high mounting density.

The setting of land portion 16, etc. of lead frame 10 to a right location can be performed instead by providing an alignment through hole and inserting an aligning pin thereto (not shown in the drawing). Or, through hole 11 already existing in lead frame 10 may be utilized for the purpose after providing a counterpart protrusion.

The above methods can be applied also to the manufacturing process of heat conductive substrates described in embodiment 2.

Fourth Exemplary Embodiment

Another modification of process which is applicable to the manufacturing process of heat conductive substrate described in embodiment 2 is given in the following with reference to the drawings. Those portions identical to those of embodiment 2 are represented by using the same symbols, and description of which is eliminated. FIG. 11A through FIG. 11D are cross sectional views used to describe the manufacturing method in accordance with the present embodiment 4, which employs no film for the cutting of connecting portion.

Figure 11A:
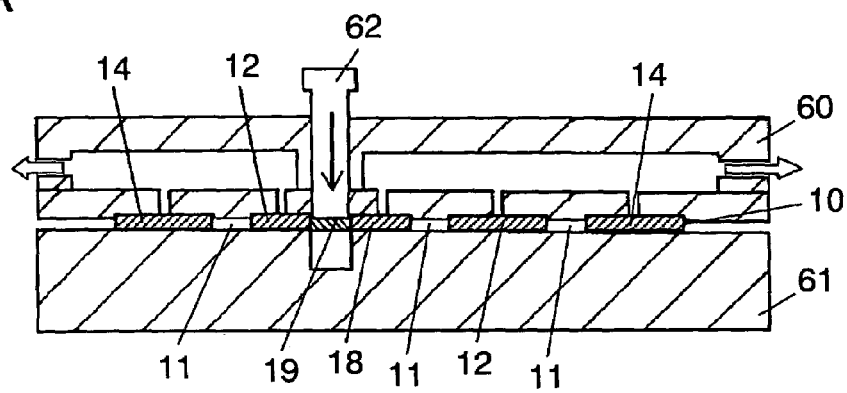
FIGS. 11A through 11D are cross sectional views used to describe the process of manufacturing heat conductive substrates in accordance with a fourth exemplary embodiment of the present invention.

Film 21 for the cutting of connecting portion was used in embodiment 2. In the present embodiment 4, vacuum sucking device 60 is used for the purpose. Lead frame 10 shown in FIG. 11A is provided with pattern 12, connection terminal 13, frame 14, orientation hole 15, etc. as illustrated in FIG. 5A. Electrically isolated island 18 is also included.

Isolated island 18 is connected and supported by adjacent pattern 12 via connecting portion 19. Lead frame 10 is sucked by vacuum sucking device 60 at the surface reverse to components mounting surface. Thus lead frame 10 is held sandwiched by vacuum sucking device 60 and lower die 61. In this state, connecting portion 19 is punched through in the direction from the reverse surface towards components mounting surface, by means of punching die 62.

Figure 11B:
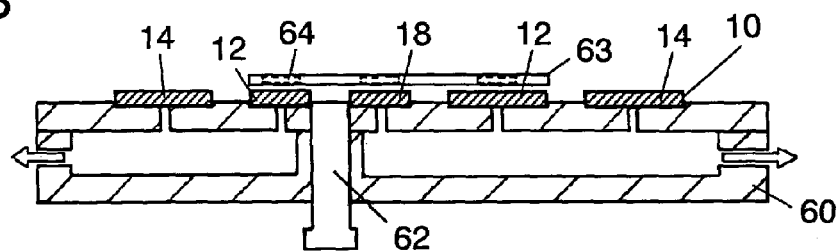
Figure 11C:
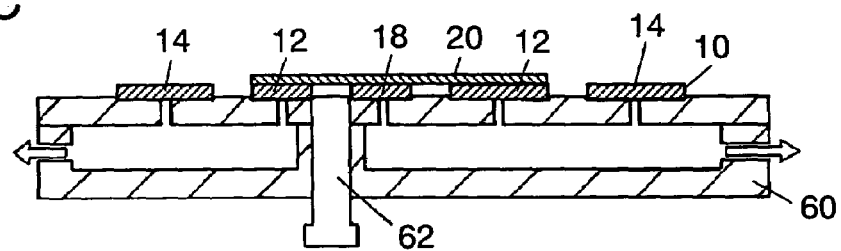

Lead frame 10, which is sucked and held by vacuum sucking device 60 with its connecting portion 19 being punched through, is turned upside down. Next, as shown in FIG. 11B, adhesive agent (not shown) is applied on the components mounting surface by coating or printing method via mask window 64 of mask 63. Formation film 20 is attached via the adhesive agent, as shown in FIG. 11C. In this way, pattern 12 and isolated island 18 of lead frame 10 can be held at their right position by formation film 20, without the help of film 21 for the cutting of connecting portion. Lead frame 10 having formation film 20 for the right positioning is turned upside down once again.

Figure 11D:
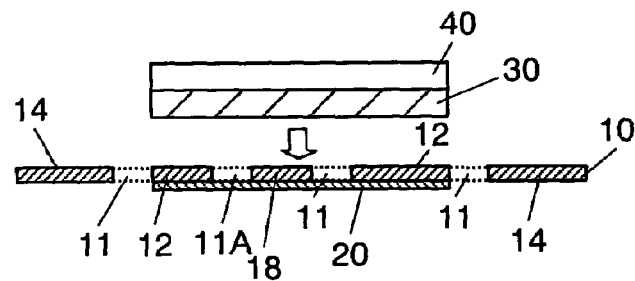

As shown in FIG. 11D, the integrated body is laminated on the surface reverse to components mounting surface of lead frame so that the thermosetting resin composite 30 side makes contact thereto. Although formation film 20 is attached in the present embodiment 4 by making use of mask 63, an adhesive film may be used instead.

Any other means may be used for supporting and holding pattern 12 and isolated island 18 of lead frame 10 at their right location, in so far as the means holds them surely without leaving a gap, does not peel off easily. The above described process of the present embodiment 4 can be applied also to the process of embodiment 1 shown in FIG. 1B, if the process of embodiment 1 is modified so that formation film 20 is attached while lead frame 10 is being sucked at the surface reverse to components mounting surface.

Fifth Exemplary Embodiment

Figure 12A:
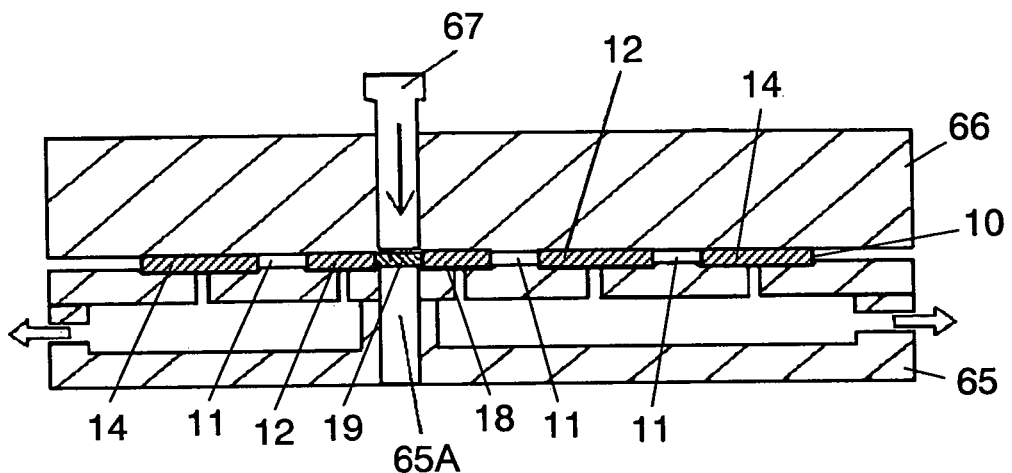
FIGS. 12A and 12B are cross sectional views used to describe the process of manufacturing heat conductive substrates in accordance with a fifth exemplary embodiment of the present invention.
Figure 12B:
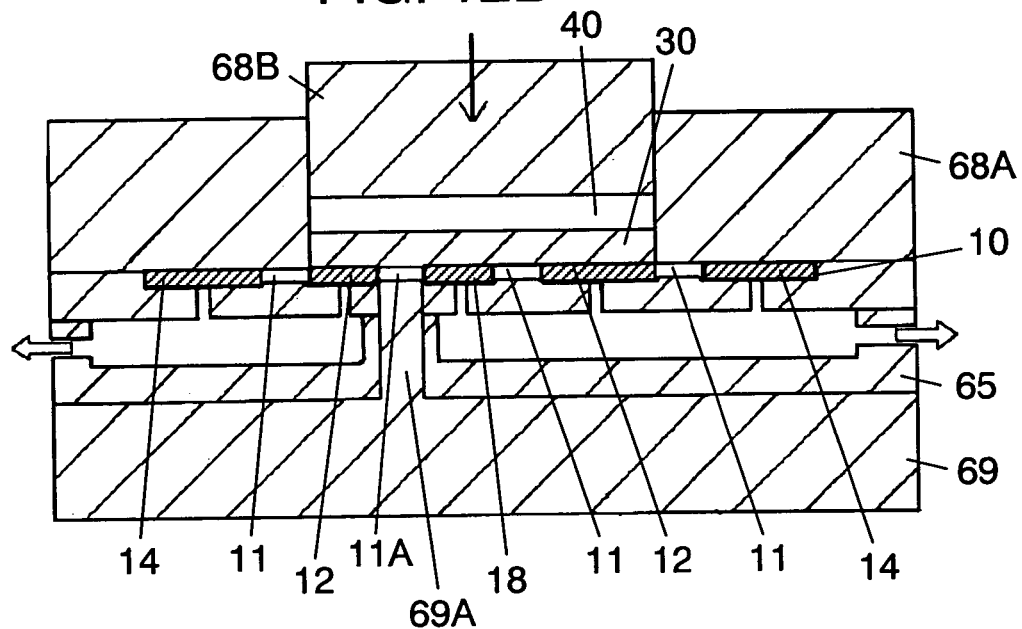

A modification to the heat conductive substrate manufacturing method in accordance with embodiment 4 is described referring to the drawings. Those portions identical to those of embodiment 4 are represented by using the same symbols, and description of which is eliminated. As shown in FIG. 12A, lead frame 10 is sucked by vacuum sucking device 65 at the components mounting surface. Lead frame 10 is held sandwiched by vacuum sucking device 65 and upper die 66. In this state, connecting portion 19 is punched through in the direction from the reverse surface towards components mounting surface, by means of punching die 67. Next, as shown in FIG. 12B, the integrated body is laminated on lead frame 10, which lead frame has been punched through at connecting portion 19 and is being sucked and held firmly by vacuum sucking device 65. The laminated body and vacuum sucking device 65 are held between upper dies 68A, 68B and lower die 69, and are heat-pressed. When, a preventive measure has to be taken so that thermosetting resin composite 30 does not proceed, in addition to through hole 11A, to punch-through hole 65A which has been provided in vacuum sucking device 65 for punching the connecting portion away. For the prevention, push out portion 69A is provided to be fitting to the space corresponding to punch-through hole 65A of lower die 69. The manufacturing process in accordance with the present embodiment 5 does not necessitate a formation film which was indispensable to the process in embodiment 4. This contributes to a higher productivity.

Figure 13A:
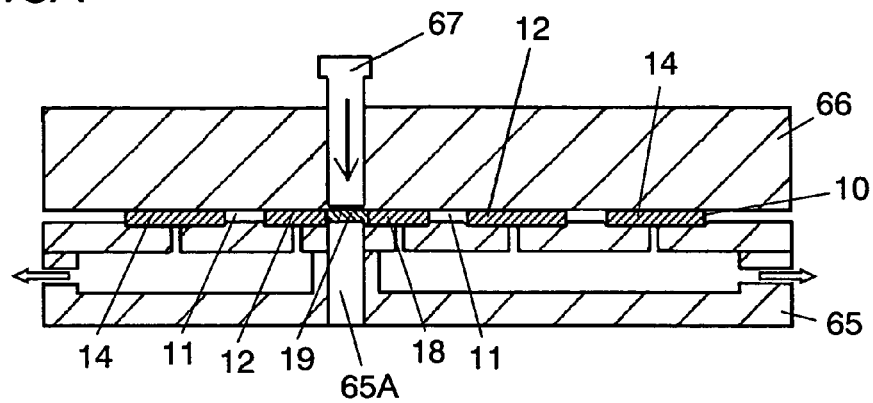
Figure 13A:
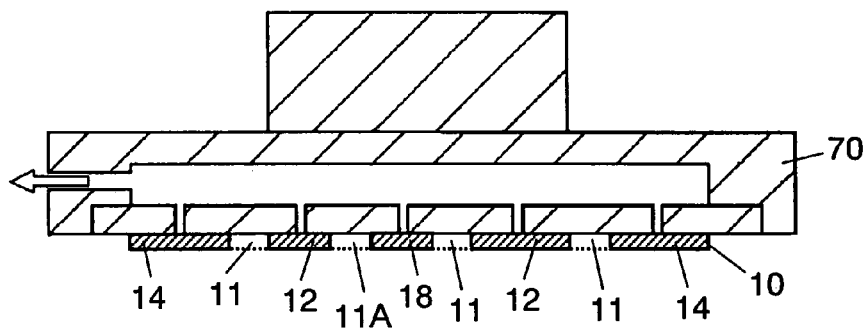

Another modification to the process described with reference to FIG. 12A and FIG. 12B is described below further referring to FIG. 13A, FIG. 13A1 and FIG. 13B. Those portions identical to those of FIG. 12A, FIG. 12B are represented by using the same symbols, and description of which is eliminated. Referring to FIG. 13A, lead frame 10 is sucked by vacuum sucking device 65 at the surface reverse to components mounting surface. Lead frame 10 is held sandwiched between vacuum sucking device 65 and upper die 66. In this state, connecting portion 19 is punched through by a punching device like punching die 67 in the direction from the reverse surface towards components mounting surface.

Next, as shown in FIG. 13A1, lead frame 10, whose connecting portion 19 has been punched away, is carried by vacuum sucking device 70 for transfer, instead of vacuum sucking device 65 used for punching connecting portion 19 through. When, the components mounting surface is surely sucked and held by vacuum sucking device 70. Lead frame 10 thus sucked and held is reversed in the positioning. Then, as shown in FIG. 13B, the integrated body is laminated on lead frame 10 at the surface reverse to components mounting surface.

The laminated body held between upper dies 71A, 71B and vacuum sucking device 70 for transfer is heat-pressed.

Figure 13B:
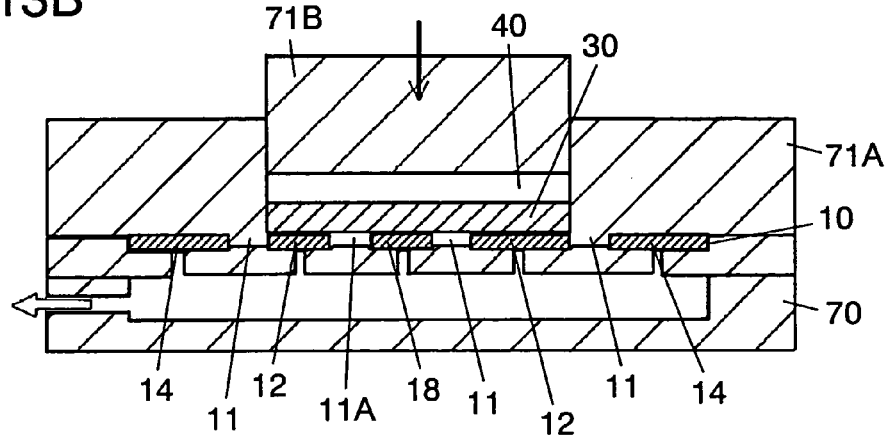
Figure 14:
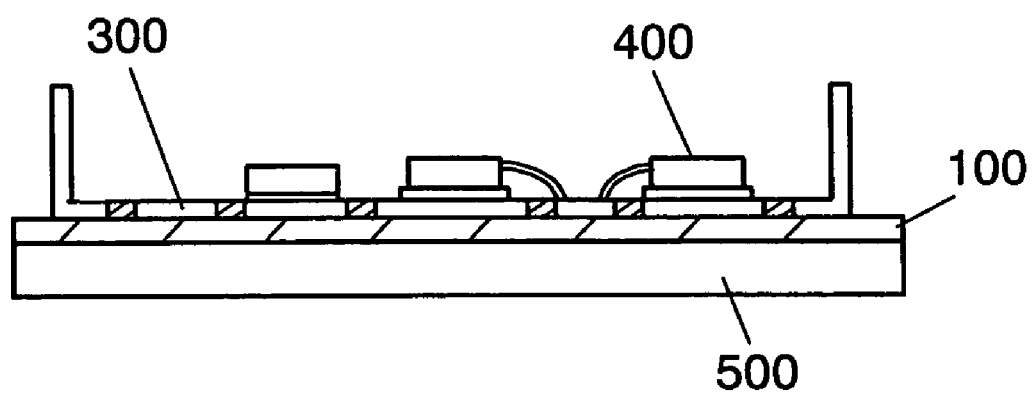
FIG. 14 is a cross sectional view showing a conventional heat conductive substrate.

As described in the above, the manufacturing process described referring to FIG. 13A and FIG. 13B does not necessitate a formation film used in embodiment 4.

The superior transfer capability contributes to an improved productivity.

INDUSTRIAL APPLICABILITY

The present invention offers a method of manufacturing a heat conductive substrate, with which substrate the surface contamination on conductive circuit element due to ooze of thermosetting resin composite during heat-pressurizing process can be suppressed.

In accordance with the manufacturing method disclosed by the present invention, the electrically isolated land portion can be formed with a high dimensional accuracy, and a high efficiency. Thus the present invention implements a heat conductive substrate that is suitable to the high-density mounting of components.

The invention claimed is:

1. A method of manufacturing a heat-conductive substrate comprising:
    forming a conductive circuit element by processing a metal sheet to have a pattern,
    attaching an adhesive film to a components-mounting surface of the conductive circuit element,
    providing an integrated body of sheet-formed flexible thermosetting resin composite and a heat dissipation plate, and forming a laminated member by laminating the integrated body onto the conductive circuit element so that the thermosetting resin composite side makes contact with the conductive circuit element at the surface opposite the components mounting surface,
    and then, heat-pressing the laminated member so that a through-hole in the conductive circuit element is filled with the thermosetting composite, and the laminated member is transformed into an integrated body by partially curing the thermosetting composite to a half-cured state,
    completely curing the thermosetting composite contained in the laminated member, and
    peeling the adhesive film off the laminated member in either its half-cured or completely cured state,
    wherein the conductive circuit element comprises a hollow at the surface opposite the components mounting surface, and a protrusion at the corresponding place of mold, the hollow and the protrusion are engaged for positioning when attaching the adhesive film on the components-mounting surface of the conductive circuit element.

2. The method of manufacturing a heat conductive substrate recited in claim 1, wherein
    the conductive circuit element comprises a hollow at an electrically isolated portion.

3. A method of manufacturing a heat conductive substrate comprising
    forming a conductive circuit element containing an electrically isolated land portion and a connecting portion connecting the land portion by patterning a metal sheet,
    attaching a first film to the conductive circuit element at the surface opposite the components mounting surface, removing the first film at the connecting portion and the corresponding location, attaching a second film on the components mounting surface of conductive circuit element and then peeling the first film attached at the opposite surface off, providing an integrated body of sheet-formed flexible thermosetting resin composite and a heat dissipation plate, and forming a laminated member by laminating the integrated body onto the conductive circuit element so that the thermosetting resin composite side makes contact with the conductive circuit element at the surface opposite the components mounting surface, heat-pressing the laminated member so that a through hole in the conductive circuit element is filled with the thermosetting composite, and the laminated member is transformed into an integrated body by partially curing the thermosetting composite to a half-cured state, completely curing the thermosetting composite contained in the laminated member, and peeling the second film off the laminated member in either its half-cured or completely cured state.

4. The method of manufacturing a heat conductive substrate recited in claim 3, wherein the second film comprises an air permeable material that blocks permeation of thermosetting composite.

5. The method of manufacturing a heat conductive substrate recited in claim 4, wherein the second film comprises a non-woven fabric.

6. The method of manufacturing a heat conductive substrate recited in claim 3, wherein the second film comprises a foam sheet whose adhesive agent foams at a temperature of at least 100° C.

7. The method of manufacturing a heat conductive substrate recited in claim 3, further comprising holding the conductive circuit element by suction at the components mounting surface when the first film is attached on the surface opposite the components mounting surface.

8. The method of manufacturing a heat conductive substrate recited in claim 3, further comprising holding the conductive circuit element by suction at the surface opposite the components mounting surface when the second film is attached on the components mounting surface.

9. The method of manufacturing a heat conductive substrate recited in claim 3, further comprising punching the conductive circuit element through in the direction from the opposite surface towards the components mounting surface for removing the connecting portion of the electrically isolated land portion, after the first film is attached on the components mounting surface.

10. The method of manufacturing a heat conductive substrate recited in claim 3, further comprising forming an integrated body by heat-pressing the laminated member in a half-cured state, taking the laminated member out of a mold, and curing the laminated member completely.

11. The method of manufacturing a heat conductive substrate recited in claim 3, further comprising forming an integrated body by heat-pressing the laminated member in a half-cured state, taking the laminated member out of a mold, and curing the laminated member completely under pressure.

12. A method of manufacturing a heat conductive substrate comprising forming a conductive circuit element containing an electrically isolated land portion and a connecting portion connecting the land portion patterning a metal sheet, attaching a first film to the conductive circuit element at the surface opposite the components mounting surface, removing the first film at the connecting portion and the corresponding location, attaching a second film on the components mounting surface of conductive circuit element and then peeling the first film attached at the opposite surface off, forming a laminated member by laminating a sheet-formed flexible thermosetting composite and a heat dissipation plate on the conductive circuit element at the surface opposite the components mounting surface, heat-pressing the laminated member so that a through hole in the conductive circuit element is filled with the thermosetting composite, and the laminated member is transformed into an integrated body by partially curing the thermosetting composite to a half-cured state, completely curing the thermosetting composite contained in the laminated member, and peeling the second film off the laminated member in either its half-cured or completely cured state.

* * * * *